United States Patent
Doub et al.

(10) Patent No.: US 9,472,458 B2
(45) Date of Patent: Oct. 18, 2016

(54) METHOD OF REDUCING RESIDUAL CONTAMINATION IN SINGULATED SEMICONDUCTOR DIE

(71) Applicant: SEMICONDUCTOR COMPONENTS INDUSTRIES, LLC, Phoenix, AZ (US)

(72) Inventors: Jason Michael Doub, Pocatello, ID (US); Gordon M. Grivna, Mesa, AZ (US)

(73) Assignee: SEMICONDUCTOR COMPONENTS INDUSTRIES, LLC, Phoenix, AZ (US)

(*) Notice: Subject to any disclaimer, the term of this patent is extended or adjusted under 35 U.S.C. 154(b) by 0 days.

(21) Appl. No.: 14/612,994

(22) Filed: Feb. 3, 2015

(65) Prior Publication Data

US 2015/0357241 A1    Dec. 10, 2015

Related U.S. Application Data

(60) Provisional application No. 62/007,794, filed on Jun. 4, 2014.

(51) Int. Cl.

| | |
|---|---|
| *H01L 21/78* | (2006.01) |
| *H01L 21/02* | (2006.01) |
| *H01L 21/683* | (2006.01) |
| *H01L 21/3065* | (2006.01) |
| *H01L 21/67* | (2006.01) |
| *H01L 23/544* | (2006.01) |

(52) U.S. Cl.
CPC ......... *H01L 21/78* (2013.01); *H01L 21/02076* (2013.01); *H01L 21/02334* (2013.01); *H01L 21/3065* (2013.01); *H01L 21/6715* (2013.01); *H01L 21/67092* (2013.01); *H01L 21/67132* (2013.01); *H01L 21/6836* (2013.01); *H01L 23/544* (2013.01); *H01L 2221/6834* (2013.01); *H01L 2221/68327* (2013.01); *H01L 2221/68336* (2013.01); *H01L 2221/68381* (2013.01); *H01L 2223/5446* (2013.01); *H01L 2223/54426* (2013.01); *H01L 2924/0002* (2013.01)

(58) Field of Classification Search
None
See application file for complete search history.

(56) References Cited

U.S. PATENT DOCUMENTS

| | | | |
|---|---|---|---|
| 5,401,690 A | 3/1995 | Chen | |
| 5,919,713 A | 7/1999 | Ishii et al. | |
| 6,406,979 B2 | 6/2002 | Fischer et al. | |
| 6,642,127 B2* | 11/2003 | Kumar | H01L 21/304 257/E21.237 |
| 6,705,925 B1* | 3/2004 | Cole | B24C 1/045 125/13.01 |
| 7,060,531 B2* | 6/2006 | Arita | H01L 21/6835 257/E21.599 |
| 7,781,310 B2 | 8/2010 | Grivna | |
| 7,985,661 B2 | 7/2011 | Grivna | |
| 7,989,319 B2 | 8/2011 | Grivna et al. | |
| 8,012,857 B2 | 9/2011 | Grivna et al. | |

(Continued)

FOREIGN PATENT DOCUMENTS

| | | |
|---|---|---|
| EP | 1873824 A1 | 1/2008 |
| WO | WO2014052445 A1 | 4/2014 |

OTHER PUBLICATIONS

Search Report for counterpart EP Application No. 13181098.8, dated Nov. 3, 2014, 5 pages.

*Primary Examiner* — Andrez Munoz
(74) *Attorney, Agent, or Firm* — Kevin B. Jackson

(57) ABSTRACT

In one embodiment, semiconductor die are singulated from a semiconductor wafer by placing the semiconductor wafer onto a carrier tape, forming singulation lines through the semiconductor wafer, and reducing the presence of residual contaminates on the semiconductor wafer.

20 Claims, 11 Drawing Sheets

(56) References Cited

U.S. PATENT DOCUMENTS

| | | | |
|---|---|---|---|
| 8,507,363 B2* | 8/2013 | Lei | H01L 21/78 257/E21.602 |
| 8,598,016 B2* | 12/2013 | Yalamanchili | H01L 21/30655 257/E21.602 |
| 8,664,089 B1 | 3/2014 | Burghout et al. | |
| 2005/0196940 A1 | 9/2005 | Yajima et al. | |
| 2009/0061595 A1 | 3/2009 | Weber et al. | |
| 2009/0191690 A1 | 7/2009 | Boyle et al. | |
| 2010/0120230 A1* | 5/2010 | Grivna | H01L 21/78 438/464 |
| 2010/0173474 A1* | 7/2010 | Arita | H01L 21/78 438/462 |
| 2011/0175242 A1 | 7/2011 | Grivna et al. | |
| 2011/0177675 A1 | 7/2011 | Grivna et al. | |
| 2011/0244657 A1 | 10/2011 | Grivna et al. | |
| 2014/0051232 A1* | 2/2014 | Burghout | H01L 21/02076 438/460 |
| 2014/0057414 A1* | 2/2014 | Iyer | H01L 21/78 438/463 |
| 2014/0134828 A1* | 5/2014 | Burghout | H01L 21/02076 438/464 |
| 2015/0228494 A1* | 8/2015 | Burghout | H01L 21/02076 438/462 |

* cited by examiner

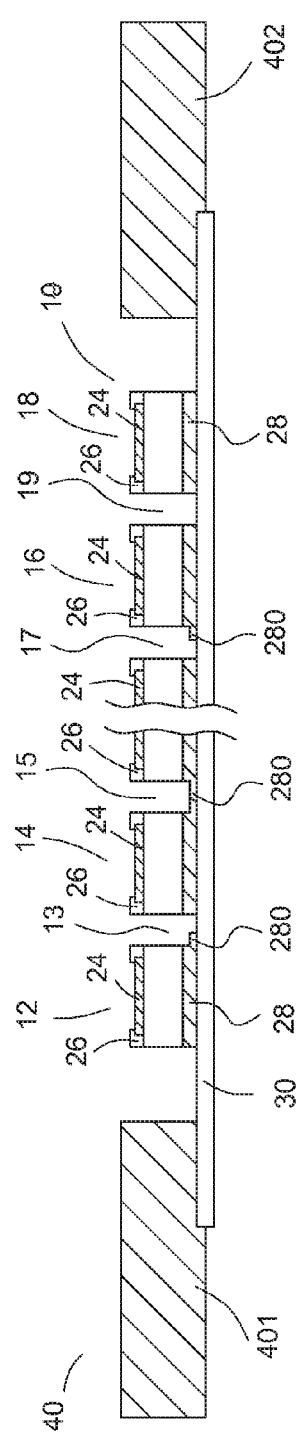
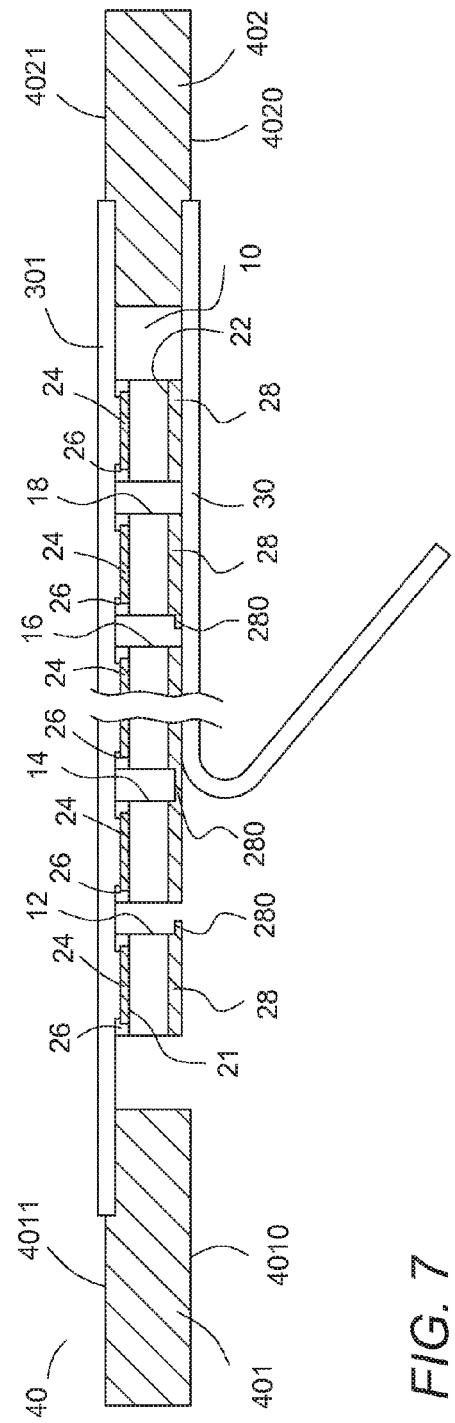
FIG. 6
FIG. 7

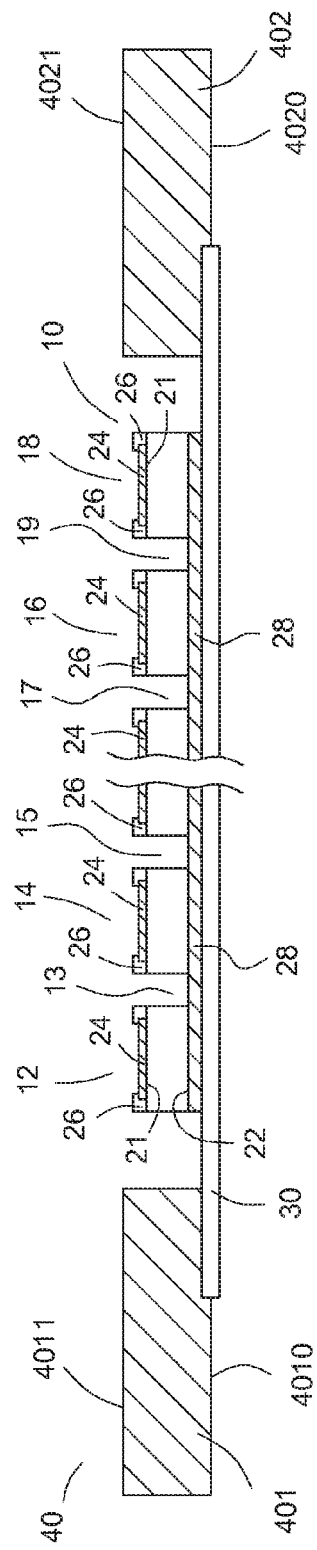
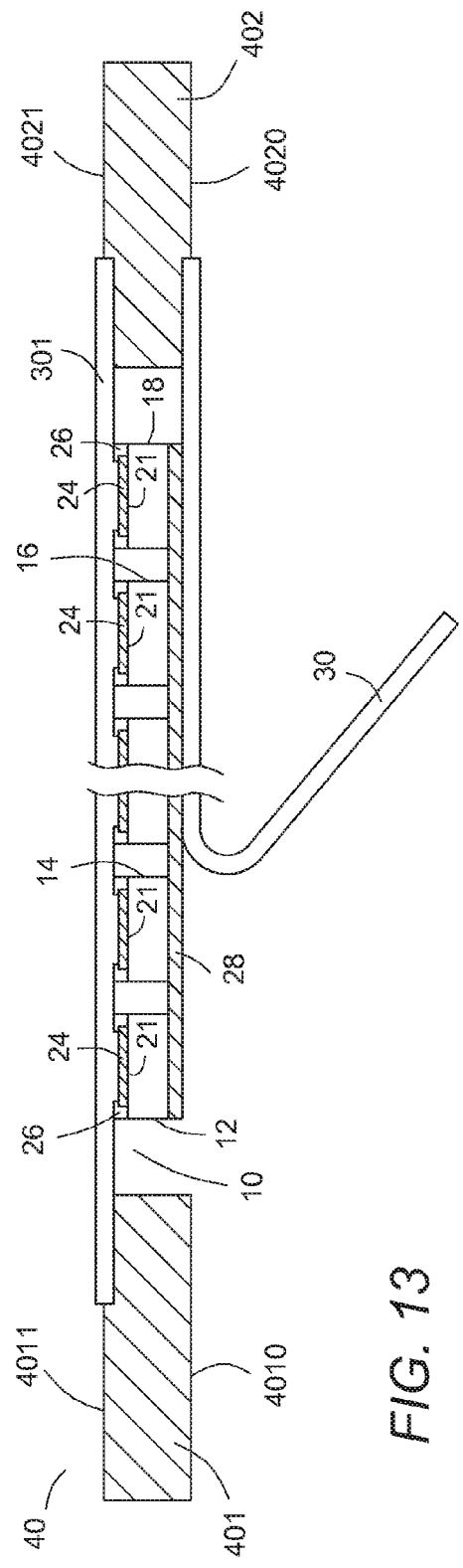
FIG. 12
FIG. 13

METHOD OF REDUCING RESIDUAL CONTAMINATION IN SINGULATED SEMICONDUCTOR DIE

CROSS REFERENCE TO RELATED APPLICATIONS

This application claims the benefit of priority from U.S. Provisional Application No. 62/007,794, which was filed on Jun. 4, 2014 which is fully incorporated herein.

BACKGROUND

The present invention relates, in general, to electronics and, more particularly, to methods of forming semiconductors.

In the past, the semiconductor industry utilized various methods and equipment to singulate individual semiconductor die from a semiconductor wafer on which the die was manufactured. Typically, a technique called scribing or dicing was used to either partially or fully cut through the wafer with a diamond cutting wheel along scribe grids or singulation lines that were formed on the wafer between the individual die. To allow for the alignment and the width of the dicing wheel each scribe grid usually had a large width, generally about one hundred fifty (150) microns, which consumed a large portion of the semiconductor wafer. Additionally, the time required to scribe each singulation line on the semiconductor wafer could take over one hour or more. This time reduced the throughput and manufacturing capacity of a production facility.

Other methods, which have included thermal laser separation (TLS), stealth dicing (laser dicing from the backside of the wafer), and plasma dicing, have been explored as alternatives to scribing. Plasma dicing is a promising process compared to scribing and other alternative processes because it supports narrower scribe lines, has increased throughput, and can singulate die in varied and flexible patterns. However, plasma dicing has had manufacturing implementation challenges. Such challenges have included non-compatibility with wafer backside layers, such as back-metal layers, because the etch process has been unable to effectively remove the backside layers from the singulation lines. Removing the backside layers from the scribe lines is necessary to facilitate subsequent processing, such as pick-and-place and assembly processes. Further, plasma dicing can leave contaminates, such as residual polymer materials or fluorine residues, on surfaces, including but not limited to sidewall surfaces, of the singulated die. Such contaminants can reduce the quality and reliability of the singulated die.

Accordingly, it is desirable to have a method of reducing the presence of residual contaminates from die separated from a semiconductor wafer. It would be beneficial for the method to be cost effective, and to minimize any damage to the separated die.

BRIEF DESCRIPTION OF THE DRAWINGS

FIGS. 2-10 illustrate partial cross-sectional views of an embodiment of the semiconductor wafer of FIG. 1 at various stages in a process of singulating die from the wafer in accordance with an embodiment of the present invention;

FIGS. 12-15 illustrate partial cross-sectional views of an embodiment of the semiconductor wafer of FIG. 1 at various stages of singulating die from the wafer in accordance with another embodiment of the present invention.

For simplicity and clarity of the illustration, elements in the figures are not necessarily drawn to scale, and the same reference numbers in different figures denote the same elements. Additionally, descriptions and details of well-known steps and elements are omitted for simplicity of the description. For clarity of the drawings, certain regions of device structures, such as doped regions or dielectric regions, may be illustrated as having generally straight line edges and precise angular corners. However, those skilled in the art understand that, due to the diffusion and activation of dopants or formation of layers, the edges of such regions generally may not be straight lines and that the corners may not be precise angles. Furthermore, the term "major surface" when used in conjunction with a semiconductor region, wafer, or substrate means the surface of the semiconductor region, wafer, or substrate that forms an interface with another material, such as a dielectric, an insulator, a conductor, or a polycrystalline semiconductor. The major surface can have a topography that changes in the x, y and z directions.

DETAILED DESCRIPTION OF THE DRAWINGS

Figure 1:
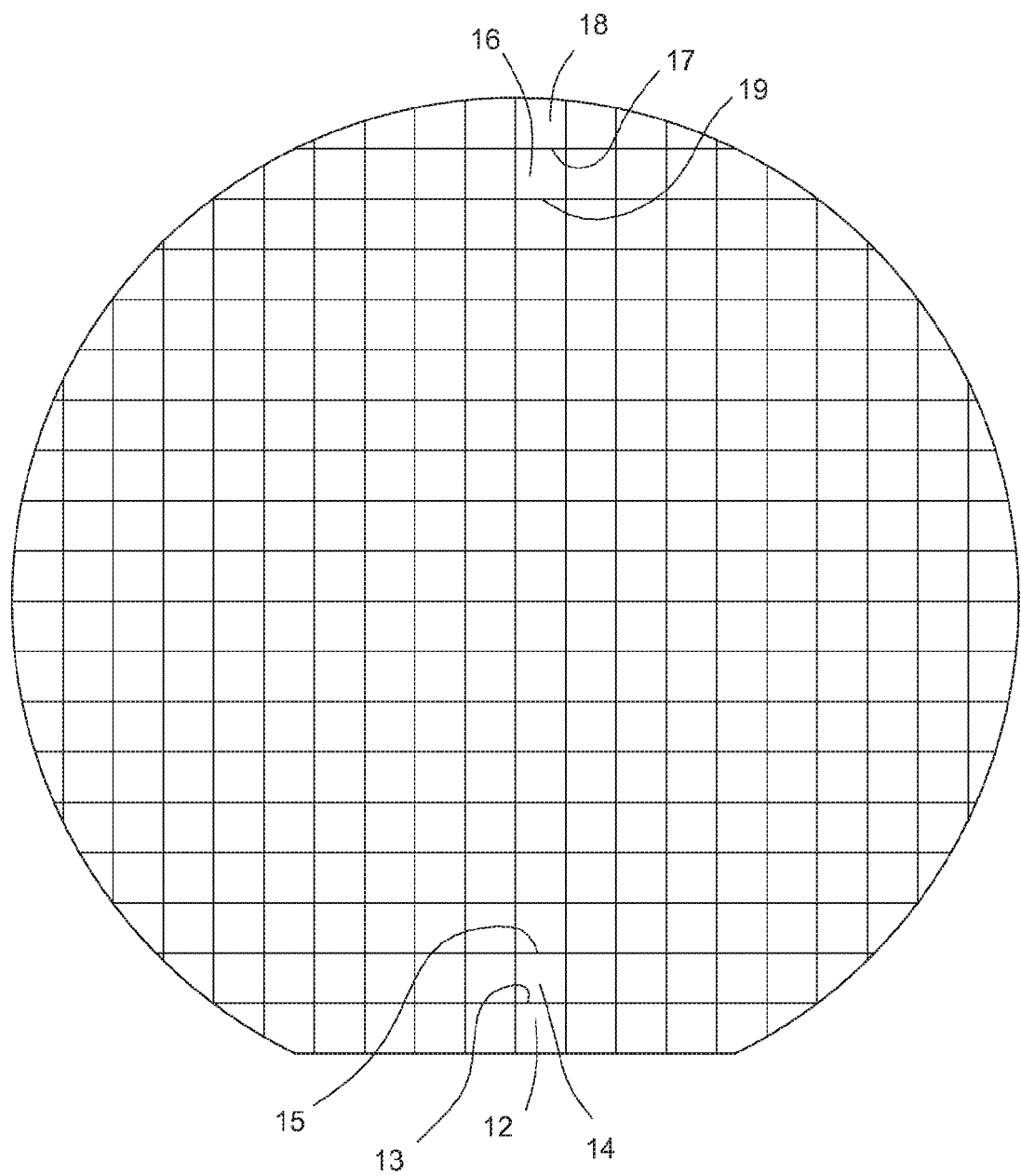
FIG. 1 illustrates a reduced plan view of an embodiment of a semiconductor wafer in accordance with the present invention.

FIG. 1 is a reduced plan view that graphically illustrates a semiconductor wafer 10 at a later step in fabrication. Wafer 10 includes a plurality of semiconductor die, such as die 12, 14, 16, and 18, that are formed on or as part of semiconductor wafer 10. Die 12, 14, 16, and 18 are spaced apart from each other on wafer 10 by spaces in which singulation lines are to be formed or defined, such as scribe lines or singulation lines 13, 15, 17, and 19. As is well known in the art, all of the semiconductor die on wafer 10 generally are separated from each other on all sides by areas where scribe lines or singulation lines, such as singulation lines 13, 15, 17, and 19 are to be formed. Die 12, 14, 16, and 18 can be any kind of electronic device including semiconductor devices such as diodes, transistors, discrete devices, sensor devices, optical devices, integrated circuits or other devices known to one of ordinary skill in the art. In one embodiment, wafer 10 has completed wafer processing including the formation of a backside layer described hereinafter.

Figure 2:
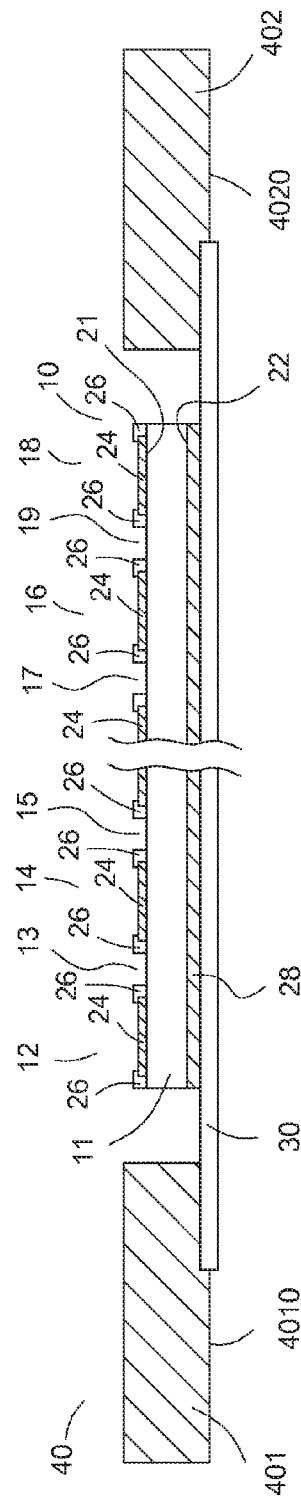

FIG. 2 illustrates an enlarged cross-sectional view of wafer 10 at an early step in a die singulation method in accordance with a first embodiment. In one embodiment, wafer 10 is attached to a carrier substrate, transfer tape, or carrier tape 30 that facilitates supporting the plurality of die after they are singulated. Such carrier tapes are well known to those of skill in the art. In one embodiment, carrier tape 30 can be attached to a frame 40, which can include frame portions or portions 401 and 402. As illustrated, carrier tape 30 can be attached to surface 4010 of frame portion 401 and to surface 4020 of frame portion 402.

In the cross-section illustrated, wafer 10 can include a bulk substrate 11, such as a silicon substrate, which can include opposing major surfaces 21 and 22. In one embodiment, contact pads 24 can be formed along portions of major surface 21 to provide for electrical contact between structures formed within substrate 11 and next levels of assembly or external elements. For example, contact pads 24 can be formed to receive bonding wires or clips that may be subsequently attached to contact pads 24, or contact pads 24 can be formed to receive a solder ball, bump or other type of attachment structure. Contact pads 24 generally can be a metal or other conductive material. Typically, a dielectric material 26 such as a blanket deposited dielectric layer can be formed on or overlying major surface 21 to function as a passivation layer for wafer 10. In one embodiment, dielectric material 26 can be a material that etches at a slower rate than that of substrate 11. In one embodiment, dielectric material 26 can be a silicon oxide, silicon nitride, or polyimide when substrate 11 is silicon.

In one embodiment, openings can be formed in dielectric material 26 (and other dielectric layers that can be formed underneath dielectric material 26) to expose underlying surfaces of contact pads 24 and surfaces of substrate 11 where singulation lines 13, 15, 17, and 19 are to be formed. As illustrated and in accordance with the present embodiment, wafer 10 further includes a layer of material 28 formed on or overlying major surface 22 of wafer 10. In one embodiment, layer 28 can be a conductive backmetal layer. In one embodiment, layer 28 can be a multi-layer metal system such as titanium/nickel/silver, titanium/nickel/silver/tungsten, chrome/nickel/gold, copper, copper alloys, gold, or other materials known to those skilled in the art. In another embodiment, layer 28 can be a wafer backside coating (WBC) film, such as a die-attach coating.

Figure 3:
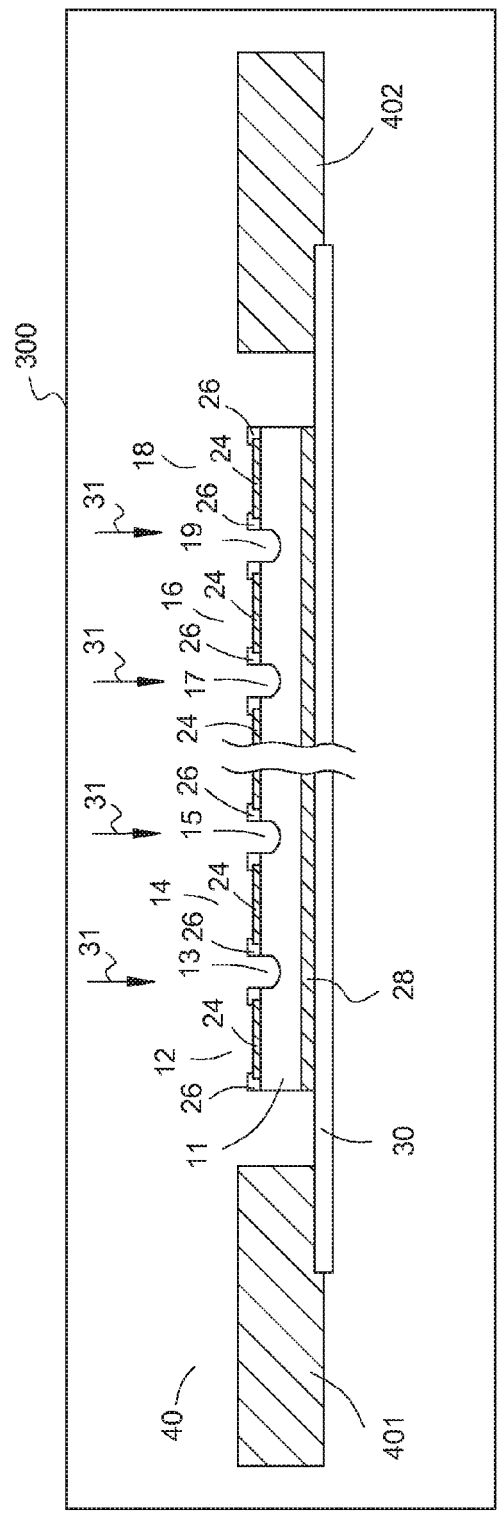
Figure 4:
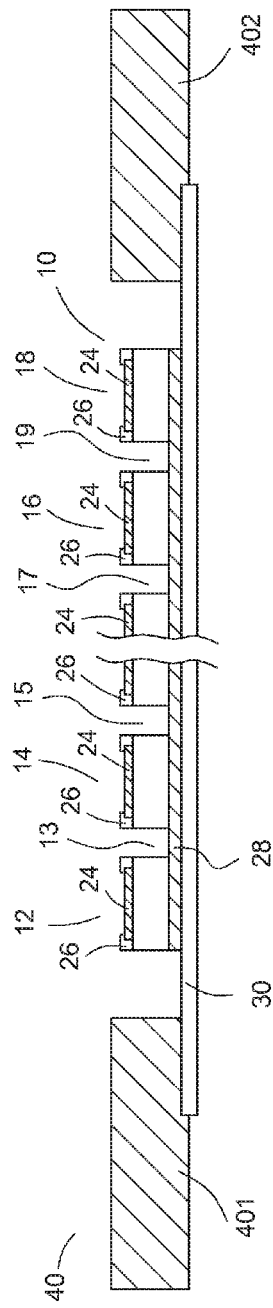

FIG. 3 illustrates an enlarged cross-sectional view of wafer 10 at a subsequent step during a plasma etch singulation process. In one embodiment, wafer 10 can be mounted on carrier tape 30 and then can be placed within an etch apparatus 300, such as a plasma etch apparatus. In one embodiment, substrate 11 can be etched through the openings to form or define singulation lines or openings 13, 15, 17, and 19 extending from major surface 21. The etching process can be performed using a chemistry (generally represented as arrows 31) that selectively etches silicon at a much higher rate than that of dielectrics and/or metals. In one embodiment, wafer 10 can be etched using a process commonly referred to as the Bosch process. In one embodiment, wafer 10 can be etched using the Bosch process in a deep reactive ion etch system. Such a system is available from PlasmaTherm LLC of St. Petersburg, Fla., U.S.A. In one embodiment, the width of singulation lines 13, 15, 17, and 19 can be from about five microns to about fifteen microns. Such a width is sufficient to ensure that the openings that form singulation lines 13, 15, 17, and 19 can be formed completely through substrate 11 stopping proximate to layer 28 because of the etch selectivity as generally illustrated in FIG. 4. In one embodiment, layer 28 can be used as a stop layer for the plasma etch singulation process. In one embodiment, singulation lines 13, 15, 17, and 19 can be formed in about fifteen to about thirty minutes using the Bosch process.

Figure 5:
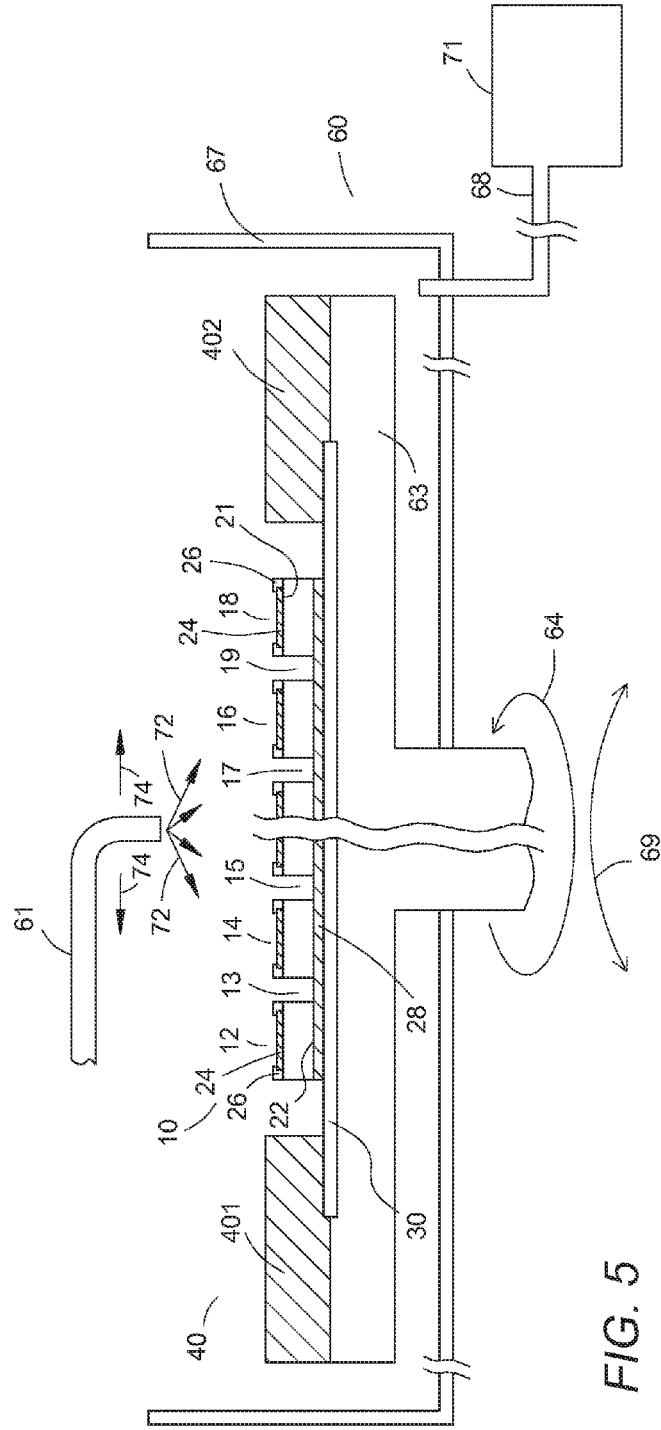

FIG. 5 illustrates a cross-sectional view of wafer 10 at a subsequent process step. In one embodiment, a pressurized fluid removal step, a fluid ablation step, or a fluid machining step is used to remove portions of layer 28 from within singulation lines 13, 15, 17, and 19 in accordance with the present embodiment. In one embodiment, frame 40 including wafer 10 on carrier tape 30 can be placed in a fluid spin rinse apparatus 60. In one embodiment, major surface 21 of wafer 10 can be facing upward or away from carrier tape 30. In one embodiment, apparatus 60 can be configured with a nozzle or dispense fixture 61 placed above wafer 10 as illustrated in FIG. 5. Frame 40 and carrier tape 30 can be placed on a support structure 63 such as a vacuum chuck. In one embodiment, structure 63 can be configured to spin or rotate as generally represented by arrow 64. In one embodiment, structure 63 can be configured to stretch or expand carrier tape 30, as generally represented by arrow 69, to contribute additional forces to layer 28 to assist in its removal or separation from within the singulation lines.

Apparatus 60 can include a tub or basin structure 67, which can function to contain and to collect process effluent through outlet 68 into a collection tub 71. One benefit of the present method and apparatus is that material from layer 28 removed during the machining process can be saved for reclaim or for an environmentally appropriate disposal technique.

In one embodiment, layer 28 can be removed or machined using the process described above in a Disco brand spin-rinse apparatus. During the process, a machining medium, such as a fluid 72, can be dispensed from nozzle 61 while structure 63 and wafer 10 rotate. In one embodiment, nozzle 61 can move or swing across wafer 10 as generally represented by arrows 74. In one embodiment, fluid 72 can be liquids, gases, mixtures thereof, or another material that removes layer 28 while minimizing damage to or causing unwanted contamination of die 12, 14, 16, and 18. In one embodiment, fluid 72 can be water. In another embodiment, fluid 72 can be air or nitrogen. In one embodiment, a surfactant can be added to fluid 72, such as a Diamaflow™ surfactant manufactured by KETECA of Phoenix, Ariz., U.S.A. In one embodiment, an abrasive material can be added to fluid 72.

In other embodiments, fluid 72 can be a component configured to reduce the presence of residual films or layers left on the outer or exposed surfaces of die 12, 14, 16, and 18 including sidewall surfaces adjacent singulation lines 13, 15, 17, and 19. In one embodiment, fluid 72 can be an electronic grade solvent configured to reduce the presence of residual polymer material(s) and/or other contaminants or unwanted solutes (for example, fluorinated solutes) remaining on the die after the plasma dicing process with minimal impact on the characteristics of carrier substrate 30. It is contemplated that removing approximately several microns of residual material should not significantly damage carrier substrate 30. In one embodiment, a fluid 72 can be acetone, acetonitrile, methanol, 2-propanol, other solvents miscible in water, or other components capable of removing unwanted solutes as known to those of ordinary skill in the art. In one embodiment, fluid 72 can be a mixture of de-ionized water and acetone. In some embodiments, fluid 72 can be applied at room temperature. In other embodiments, fluid 72 can be heated or cooled. In an alternative embodiment, wafer 10 can be immersed in a bath containing fluid 72. In a further embodiment, fluid 72 does not have to be pressurized but instead can be deposited onto wafer 10 and then wafer 10 can be rotated at a high speed to spread fluid 72 across wafer 10. In other embodiments, fluid 72 can be disposed or provided on or both sides of wafer 10 and carrier 40 using a batch spray tool, such as a spray solvent tool. Such a tool is available from Applied Materials of Santa Clara, Calif., U.S.A. In accordance with the present embodiment, the term solvent includes, but is not limited, a substance that is configured to dissolve another material; or a substance that is configured to undercut a material, which can then be washed away.

In one embodiment, the following process conditions can be used to remove layer 28. For example, fluid 72 can be de-ionized water at a pressure from about 10,342 Kilopascal (Kpa) to about 20,684 Kpa (about 1500 pounds/square inch (psi) to about 3000 psi) as measured at the fluid pump. Wafer 10 can be spinning at a rate from about 700 rpm to 1500 rpm with fluid 72 flowing onto wafer 10 from about 2 minutes to about 5 minutes.

It is understood that the method described herein can also be used to remove other structures, such as alignment keys, test structures, and/or residual semiconductor material, from within singulation lines 13, 15, 17, and/or 19 that may not be removed during the plasma etch process. The steps described hereinafter can be used in one embodiment to removing remaining portions 280 from the singulation lines.

FIG. 6 illustrates a cross-sectional view of wafer 10 after portions of layer 28 within singulation lines 13, 15, 17, and 19 have been removed. As illustrated in this embodiment, portions 280 of layer 28 can remain after the fluid machining process described previously. Portions 280 can remain because singulation lines 13, 15, 17, and 19 are configured with narrower widths when singulation processes, such as plasma-singulation, are used instead of conventional dicing processes that require much wider singulation lines.

FIG. 7 illustrates a cross-sectional view of wafer 10 at a subsequent process step. In one embodiment, carrier tape 30 can be exposed to an ultra-violet (UV) light to source to reduce the adhesiveness of the tape. Subsequently, a carrier tape 301 can be applied or attached to conductive pads 24 along upper surfaces of wafer 10 (that is, overlying major surface 21 of wafer 10), surface 4011 of frame portion 401, and surface 4021 of frame portion 402. In one embodiment, carrier tape 301 and carrier tape 30 can be similar materials. In another embodiment, carrier tape 301 can be a different material or can have different characteristics, such as adhesive and/or stretch characteristics, compared to carrier tape 30. In accordance with the present embodiment, after carrier tape 301 is applied, carrier tape 30 can be removed from wafer 10 and frame 40 to expose layer 28 and portions 280.

Figure 8:
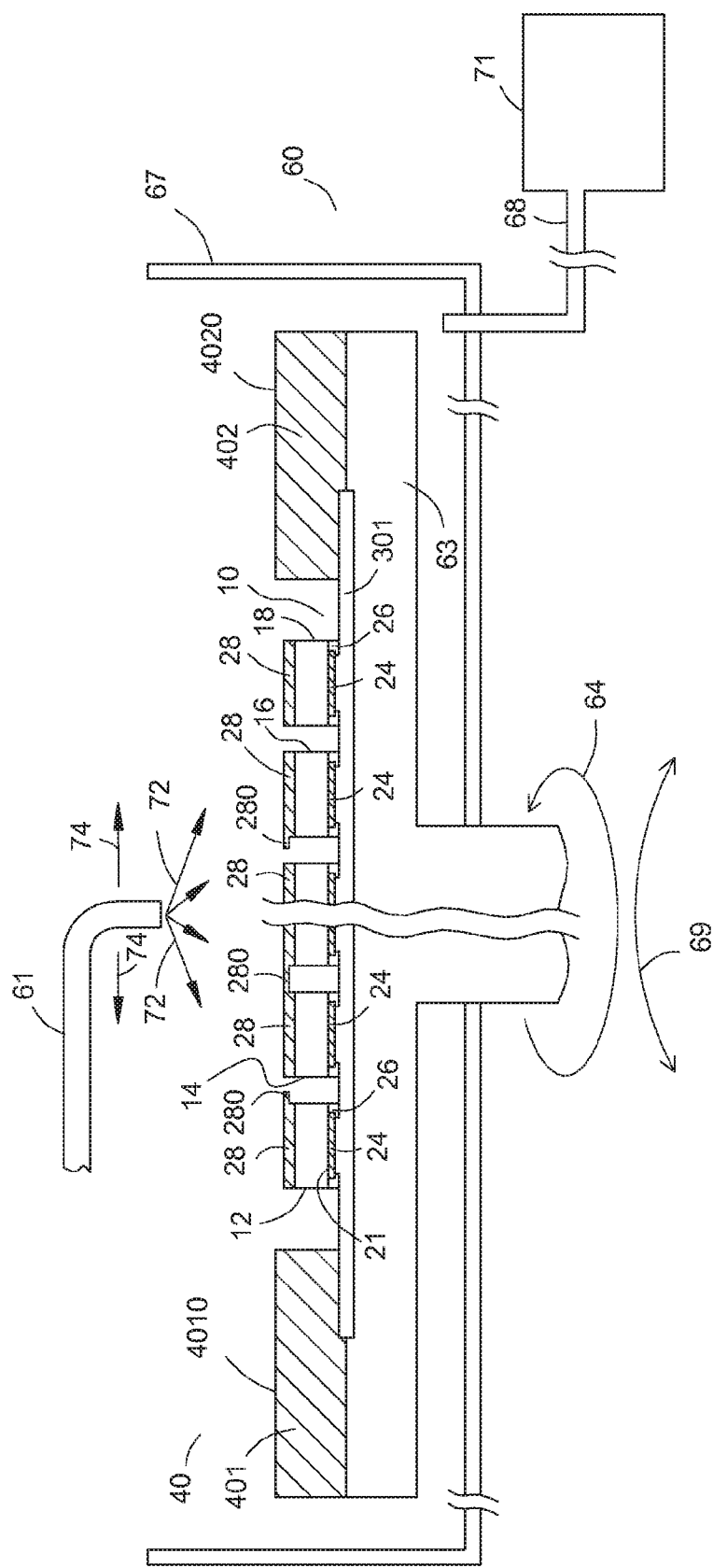
Figure 9:
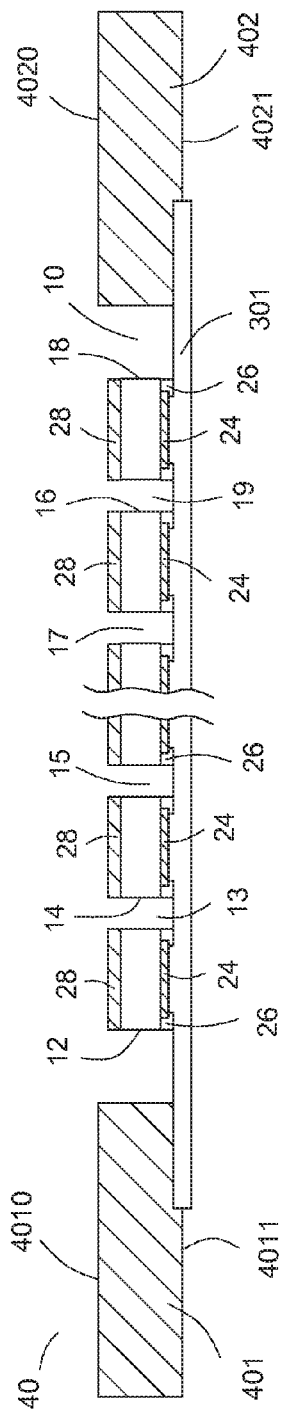

FIG. 8 illustrates a cross-sectional view of wafer 10 during subsequent processing. In one embodiment, wafer 10 is placed again within apparatus 60 with layer 28 facing upward (or towards nozzle 61), and portions 280 of layer 28 can be removed using the fluid machining process as described previously. For example, fluid 72 can be de-ionized water at a pressure from about 10,342 Kpa to about 20,684 Kpa (about 1500 psi to about 3000 psi) as measured at the fluid pump. Wafer 10 can be spinning at a rate from about 700 rpm to 1500 rpm with fluid 72 flowing onto wafer 10 from about 2 minutes to about 5 minutes. In one embodiment, after portions 280 of layer 28 have been removed, as well as any other unwanted materials from singulation lines 13, 15, 17, and/or 19, wafer 10 can be removed from apparatus 60 to provide the intermediate structure illustrated in FIG. 9.

Figure 10:
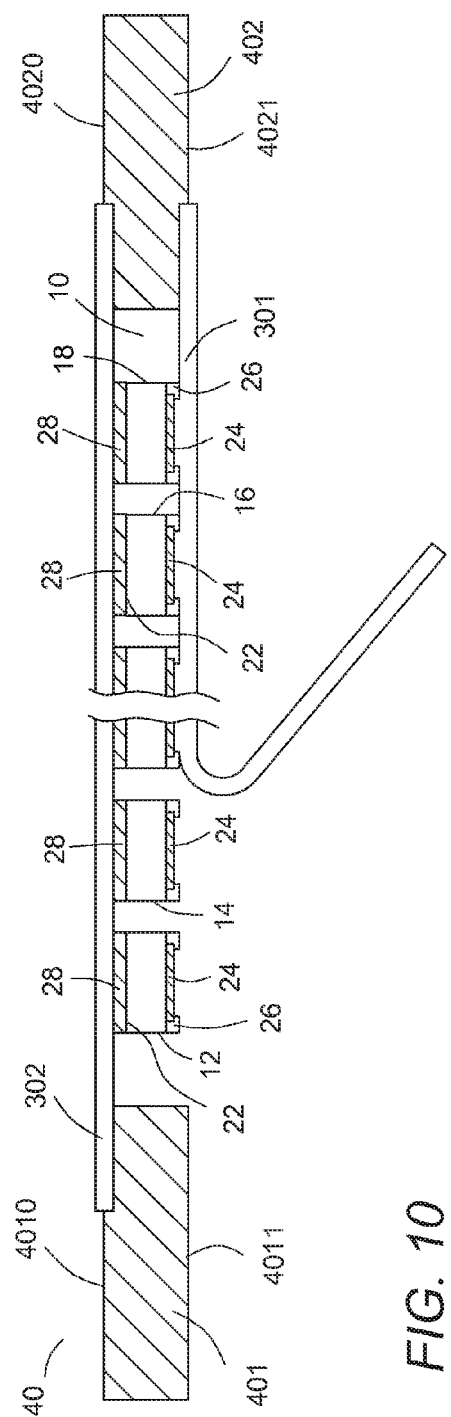
Figure 11:
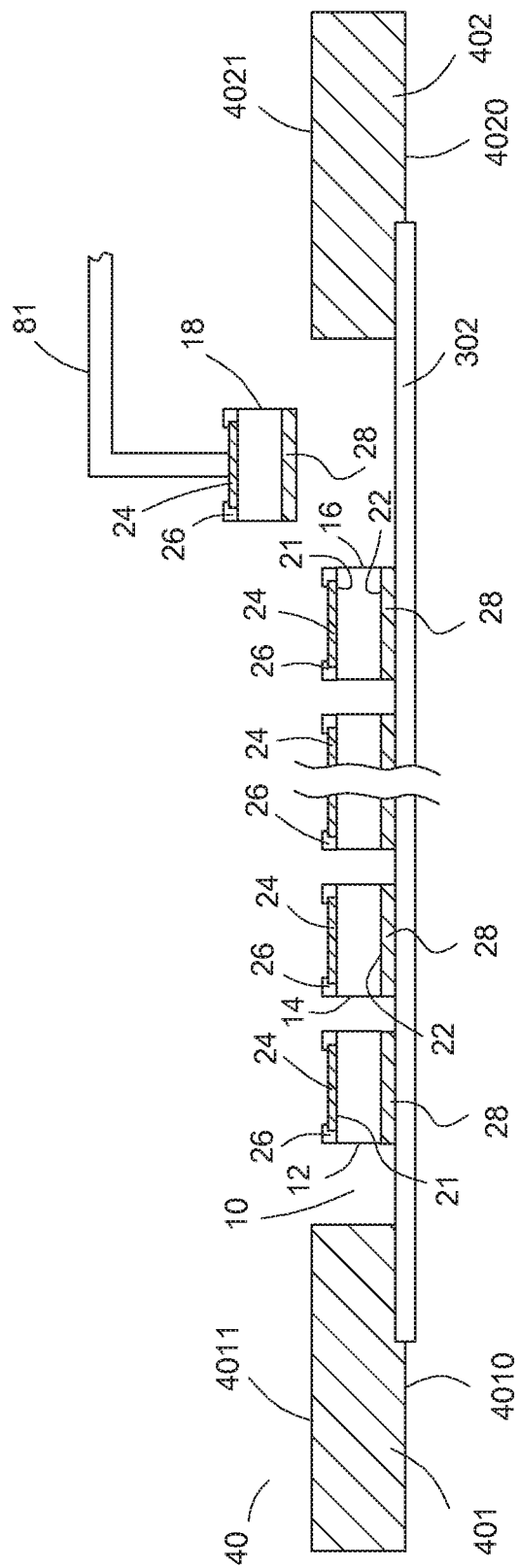
FIG. 11 illustrates a partial cross-sectional view of an embodiment of the semiconductor wafer of FIG. 10 or FIG. 15 at a later stage of processing in accordance with an embodiment of the present invention.

FIG. 10 illustrates a cross-sectional view of wafer 10 during subsequent processing. In one embodiment, carrier tape 301 can be exposed to a UV light source to reduce the adhesiveness of the tape. In one embodiment, a carrier tape 302 can be applied or attached to layer 28 of wafer 10, surface 4010 of frame portion 401, and surface 4020 of frame portion 402. In one embodiment, carrier tape 302, carrier tape 301, and carrier tape 30 can be similar materials. In another embodiment, carrier tape 302 can be a different material or can have different characteristics, such as adhesive and/or stretch characteristics, compared to carrier tape 30 and/or carrier tape 301. In accordance with the present embodiment, after carrier tape 302 is applied, carrier tape 301 can be removed from wafer 10 and frame 40 to expose conductive pads 24 overlying upper surface 21 of wafer 10. In a subsequent step, die 12, 14, 16, and 18 can be removed from carrier tape 302 as part of a further assembly process using, for example, a pick-and-place apparatus 81 as generally illustrated in FIG. 11. In one embodiment, carrier tape 302 can be exposed to a UV light source prior to the pick-and-place step to reduce the adhesiveness of the tape.

FIG. 12 illustrates a cross-sectional view of wafer 10 after a singulation process in accordance with an alternative embodiment. Wafer 10 can be attached to carrier tape 30, which is further attached to frame 40 as described previously in conjunction with FIG. 2. However, in this embodiment, carrier tape 301 can be applied or attached to contact pads 24 overlying upper surfaces of wafer 10 (that is, overlying major surface 21 of wafer 10), surface 4011 of frame portion 401, and surface 4021 of frame portion 402. In accordance with the present embodiment, after carrier tape 301 is applied, carrier tape 30 can be removed from layer 28, wafer 10, and frame 40 to expose layer 28 as illustrated in FIG. 13. In one embodiment, carrier tape 30 can be exposed to a UV light source to reduce the tackiness of the tape prior to the application of carrier tape 301.

Figure 14:
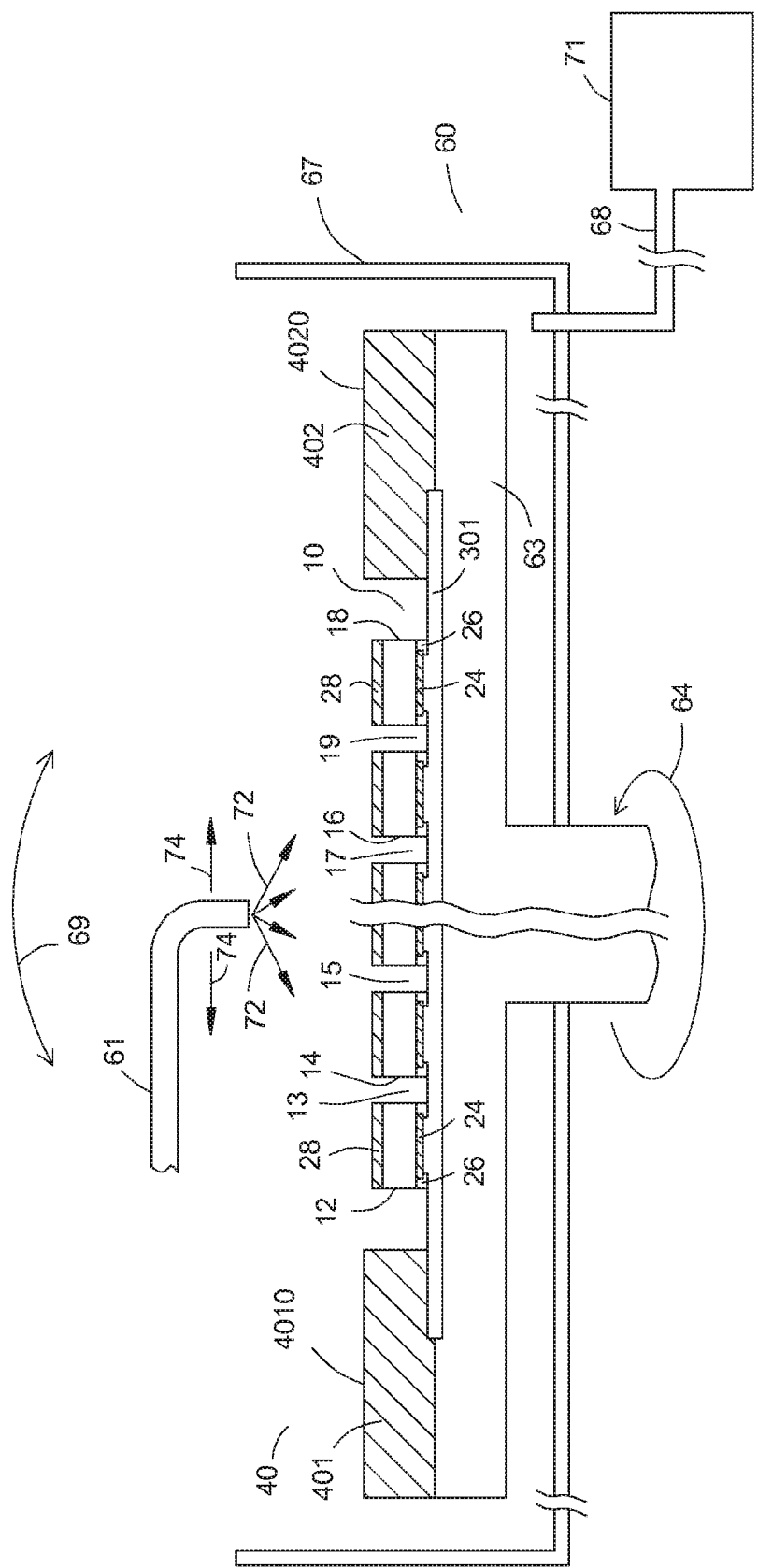

In a subsequent step, wafer 10 having layer 28 exposed or facing upward (or towards nozzle 61) is then placed within apparatus 60, and portions of layer 28 can be removed from singulation lines 13, 15, 17, and 19 as illustrated in FIG. 14. In one embodiment, the following process conditions can be used to remove portions of layer 28. For example, fluid 72 can be de-ionized water at a pressure from about 10,342 Kpa to about 20,684 Kpa (about 1500 psi to about 3000 psi) as measured at the fluid pump. Wafer 10 can be spinning at a rate from about 700 rpm to 1500 rpm with fluid 72 flowing onto wafer 10 from about 2 minutes to about 5 minutes.

Figure 15:
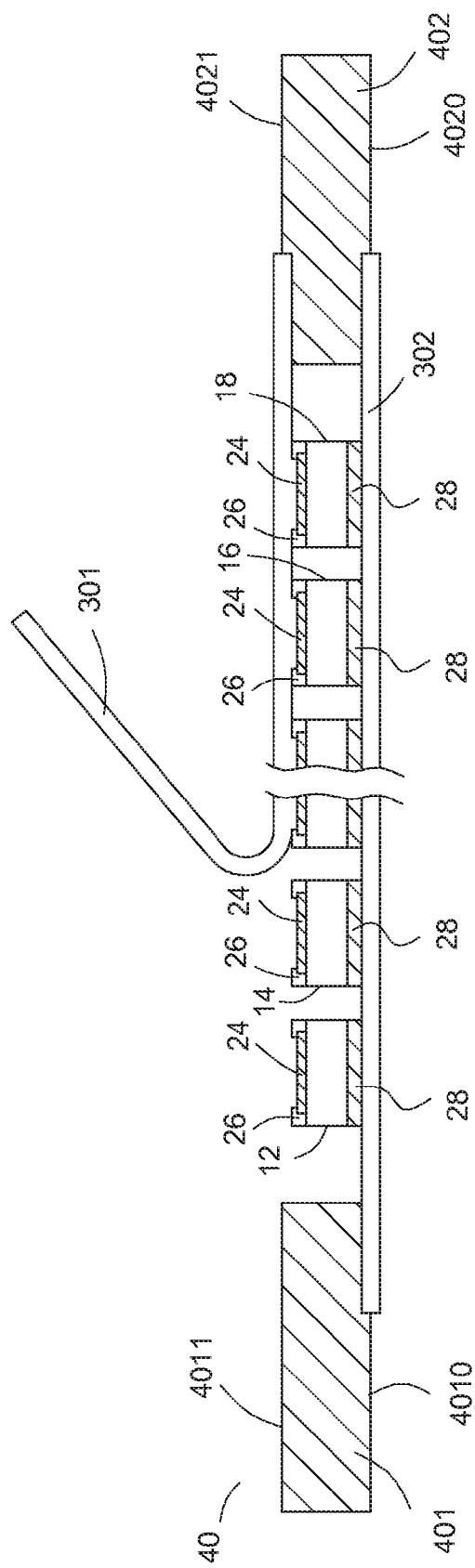

FIG. 15 illustrates a cross-sectional view of wafer 10 after further processing. In one embodiment, carrier tape 301 can be exposed to a UV light source to reduce the adhesiveness of the tape. Subsequently, carrier tape 302 can be applied or attached to layer 28 of wafer 10, surface 4010 of frame portion 401, and surface 4020 of frame portion 402. In accordance with the present embodiment, after carrier tape 302 is applied, carrier tape 301 can be removed from wafer 10 and frame 40 to expose conductive pads 24 overlying upper surface 21 of wafer 10. In a subsequent step, die 12, 14, 16, and 18 can be removed from carrier tape 302 using, for example, a pick-and-place apparatus 81 as generally illustrated in FIG. 11.

It is understood that carrier tape 30, 301, and/or 302 can be stretched or expanded during the fluid machining process to further assist in the removal of unwanted material from within the singulation lines. Also, apparatus 60 can include a megasonic apparatus to generate controlled acoustic cavitations in fluid 72. In addition, fluid 72 can be heated or cooled.

Figure 16:
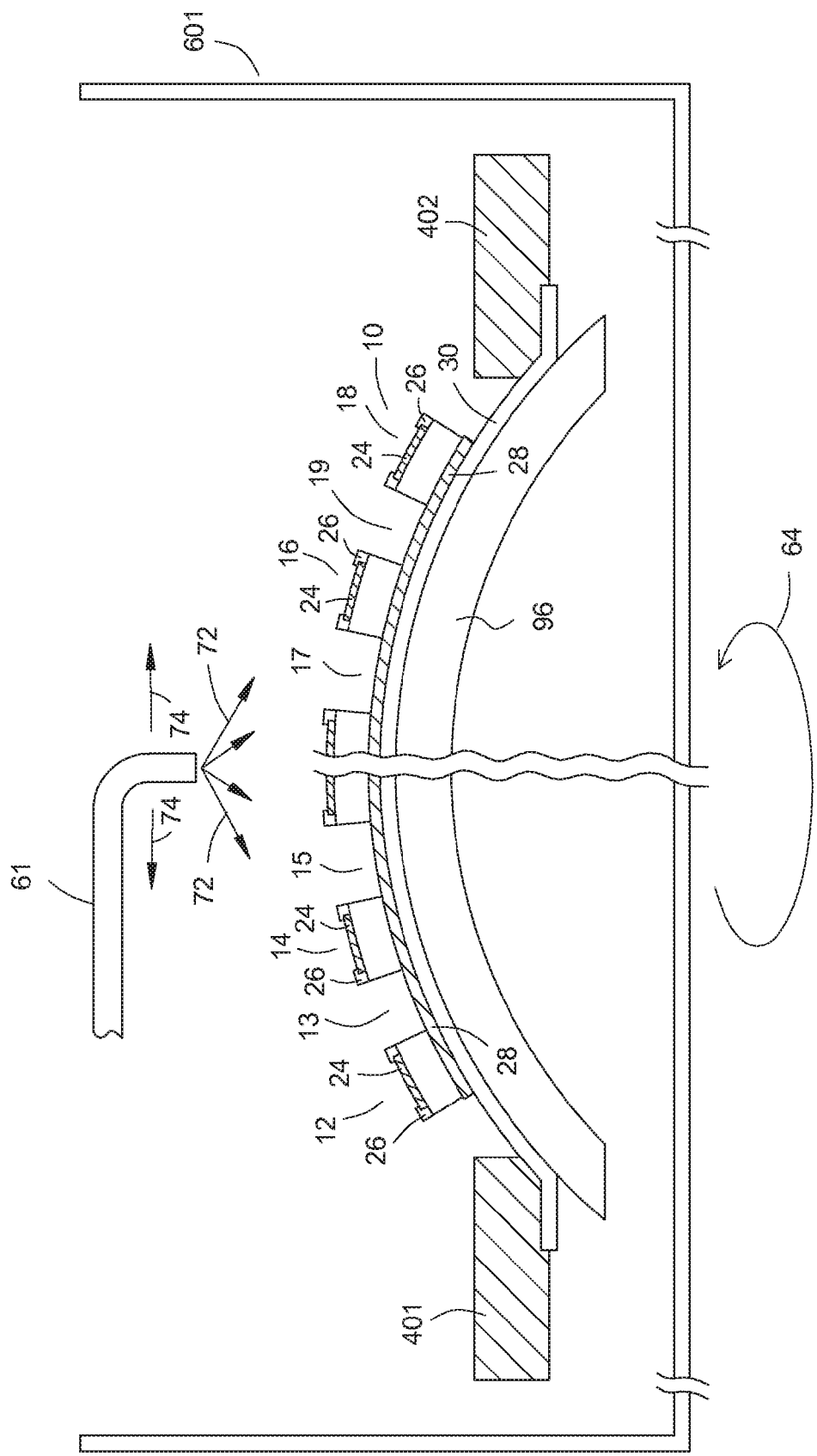
FIG. 16 illustrates a partial cross-sectional view of another embodiment of the present invention.

FIG. 16 illustrates a cross-section view of another embodiment. Wafer 10 on carrier substrate 10 can be placed in an apparatus 601, which can be similar to apparatus 60. In this embodiment, layer 28 can be a wafer backside coating (WBC) film, such as a die attach coating. In one embodiment, wafer 10 on carrier substrate 30 can be stretched to increase the distance between adjacent die. In one embodiment a work piece 96 can be used to stretch carrier substrate 30. Work piece 96 can be, for example, an arched bar or a domed structure. The stretching can enhance removal of layer 28 from singulation lines 13, 15, 17, and 19 using fluid 72. In one embodiment, wafer 10 can be cooled to a lower temperature to increase the brittleness of layer 28. In one embodiment, either fluid 72 or wafer 10 or both can be heated to enhance the removal of layer 28. In one embodiment, work piece 96 can move across wafer 10 when fluid 72 is flowing. In another embodiment, work piece 96 and wafer 10 can spin (as generally represented by arrow 64) when fluid 72 is flowing. In some embodiments, apparatus 601 can be used when reducing the presence of residual contaminants on semiconductor wafer 10 after singulation.

From all of the foregoing, one skilled in the art can determine that, according to one embodiment, a method of processing semiconductor die comprises providing a semiconductor wafer (for example, element 10) having a plurality of semiconductor die (for example, elements 12, 14, 16, 18) formed on the semiconductor wafer and separated from each other by spaces, wherein the semiconductor wafer has first and second opposing major surfaces (for example, elements 21, 22). The method includes placing the semiconductor wafer onto a first carrier substrate (for example, element 30) and singulating the semiconductor wafer through the spaces to form singulation lines (for example, elements 13, 15, 17, 19), and reducing the presence of residual contaminants from surfaces of the plurality of semiconductor die using a first fluid (for example, element 72).

In another embodiment, the method can include providing a layer of material (for example, element 28) along the second major surface, and placing the semiconductor wafer onto the first carrier substrate can include placing the layer of material adjacent the first carrier substrate. According to a further embodiment, singulating the semiconductor wafer can include stopping in proximity to the layer of material. According to a still further embodiment, the method can further comprise removing at least portions of the layer of material from the singulation lines using a second fluid that is pressurized. According to another embodiment, the second fluid can be different than the first fluid. According to a further embodiment, removing portions of the layer of material can include removing first portions of the layer of material using the second fluid while the layer of material is attached to the first carrier substrate, attaching a second carrier substrate to the first major surface of the semiconductor wafer, removing the first carrier substrate, and removing second portions of the layer of material using a third fluid. According a still further embodiment, the third fluid can be pressurized. According to another embodiment, the method can further include attaching a third carrier substrate onto the second major surface after removing the second portions and removing the second carrier substrate. According to another embodiment, removing portions of the layer of material can include attaching a second carrier substrate to the first major surface of the semiconductor wafer, removing the first carrier substrate, and removing the portions of the layer of material from the singulation lines using the second fluid. According to a further embodiment, reducing the presence of residual contaminants can include reducing the presence of polymer materials with a solvent. According to a still further embodiment, placing the semiconductor wafer onto the first carrier substrate comprises placing the semiconductor wafer onto a carrier tape. According to another embodiment, singulating the semiconductor wafer comprises plasma etching the semiconductor wafer. According to another embodiment, the method can further include stretching the first carrier substrate for at least some period of time applying the first fluid to the semiconductor wafer. According to a further embodiment, the first fluid can be pressurized. According to still further embodiment, the first fluid can be applied after the step of removing at least portions of the layer of material using the second fluid, and the first fluid can be applied from the same major surface where the layer of material is located.

From all of the foregoing, one skilled in the art can determine that according to a another embodiment, a method of singulating a substrate comprises providing a substrate (for example, element 10) having a plurality of die (for example, elements 12, 14, 16, 18) formed on the substrate and separated from each other by spaces, wherein the substrate has first and second opposing major surfaces (for example, elements 21, 22), and wherein a layer of material (for example, element 28) is formed overlying the second major surface. The method includes placing a first carrier tape (for example, element 30) onto the layer of material; plasma etching the substrate through the spaces to form singulation lines (for example, elements 13, 15, 17, 19), wherein the singulation lines terminate in proximity to the layer of material. The method includes removing at least portions of residual material from surfaces of the plurality of die using a first fluid (for example, element 72). The method includes removing portions of the layer of material from the singulation lines using a second fluid.

According to another embodiment, the method can include exposing the plurality of die to a fluid configured to reduce the presence of polymer materials. According to a further embodiment, using the second fluid can include using a pressurized fluid. According to a still further embodiment, using the first fluid can include using a pressurized fluid. According to another embodiment, the method can include exposing the plurality of die to a fluid configured to reduce the presence of fluorinated materials.

From all of the foregoing, one skilled in the art can determine that according to another embodiment, a method of singulating semiconductor die from a semiconductor wafer comprises providing the semiconductor wafer (for example, element 10) having a plurality of semiconductor die (for example, elements 12, 14, 16, 18) formed as part of the semiconductor wafer and separated from each other by spaces defining where singulation lines (for example, elements 13, 15, 17, 19) will be formed, wherein the semiconductor wafer has first and second opposing major surfaces (for example, elements 21, 22), and wherein a layer of material (for example, element 28) is formed overlying the second major surface. The method includes placing a first carrier substrate (for example, element 30) onto the layer of material. The method includes plasma etching the semiconductor wafer through the spaces to form the singulation lines while the semiconductor wafer is attached to the first carrier substrate, wherein the singulation lines terminate in proximity to the layer of material. The method includes exposing surfaces of the plurality of semiconductor die to a first fluid (for example, element 72) configured to reduce the presence of residual contamination.

According to another embodiment the method can include removing portions of the layer of material from the singulation lines. In another embodiment, removing portions of the layer of material can include exposing the layer of material to a second fluid that is pressurized. In one embodiment, the first and second fluids can be the same. In other embodiments, the first and second fluids can be different. In a further embodiment, the method can include stretching the first carrier tape during the step of exposing the surfaces of the semiconductor die.

From all of the foregoing, one skilled in the art can determine that according to yet another embodiment, a method of singulating semiconductor die from a semiconductor wafer comprises providing a semiconductor wafer (for example, element 10) having a plurality of semiconductor die (for example, element 12, 14, 16, 18) formed on the semiconductor wafer and separated from each other by spaces, wherein the semiconductor wafer has first and second opposing major surfaces. The method includes placing the semiconductor wafer onto a carrier substrate (for example, element 30) and plasma etching the semiconductor wafer through the spaces to form the singulation lines (for example, element 13, 15, 17, 19) while the semiconductor wafer is attached to the carrier substrate. The method includes exposing the plurality of semiconductor die to a means for reducing the presence of residual contaminants from surfaces of the plurality of semiconductor die (for example, element 72).

In another embodiment of the method, exposing the plurality of semiconductor die can include removing at least portions of the residual contaminants with a fluid containing a solvent. In a further embodiment, the fluid can be pressurized. In another embodiment of the method, providing the semiconductor wafer can include providing a layer of material along the second major surface, and wherein placing the semiconductor wafer onto the carrier substrate can include placing the layer of material adjacent the carrier substrate. In yet another embodiment of the method, singulating the semiconductor wafer can include stopping in proximity to the layer of material. In a still further embodiment, the method can further include removing at least portions of the layer of material from the singulation lines using a pressured fluid.

In view of all of the above, it is evident that a novel method is disclosed. Included, among other features, is placing a semiconductor wafer having a plurality of die onto a carrier tape, and forming singulation lines through the substrate to separate at least in part the plurality of die. The method includes exposing surfaces of the plurality of die to pressurized fluid to reduce the presence of residual contamination from the singulation process. The method improves the reliability and quality of the singulated die.

While the subject matter of the invention is described with specific preferred embodiments and example embodiments, the foregoing drawings and descriptions thereof depict only typical embodiments of the subject matter, and are not therefore to be considered limiting of its scope. It is evident that many alternatives and variations will be apparent to those skilled in the art. For example, other forms of removable support materials can be used instead of carrier tapes.

As the claims hereinafter reflect, inventive aspects may lie in less than all features of a single foregoing disclosed embodiment. Thus, the hereinafter expressed claims are hereby expressly incorporated into this Detailed Description of the Drawings, with each claim standing on its own as a separate embodiment of the invention. Furthermore, while some embodiments described herein include some but not other features included in other embodiments, combinations of features of different embodiments are meant to be within the scope of the invention and meant to form different embodiments as would be understood by those skilled in the art.

We claim:

1. A method for processing semiconductor die comprising:
    providing a semiconductor wafer having a plurality of semiconductor die formed on the semiconductor wafer and separated from each other by spaces, wherein the semiconductor wafer has first and second opposing major surfaces, and wherein a conductive layer is affixed adjoining the second major surface;
    placing the semiconductor wafer onto a first carrier substrate;
    plasma etching the semiconductor wafer through the spaces to form singulation lines adjacent the plurality of semiconductor die, wherein the plasma etching step stops proximate to the conductive layer in the singulation lines;
    using a water miscible solvent to reduce the presence of residual contaminants resulting from the plasma etching step from surfaces of the plurality of semiconductor die; and
    removing the conductive layer in the singulation lines using a first fluid ablation process.

2. The method of claim 1, wherein using the water miscible solvent comprises dispensing the water miscible solvent with a spray solvent apparatus.

3. The method of claim 2, wherein using the water miscible solvent comprises using a heated water miscible solvent.

4. The method of claim 1, wherein using the water miscible solvent comprises using one or more of acetone, acetonitrile, methanol, and 2-propanol.

5. The method of claim 1, wherein removing the conductive layer from the singulation lines occurs after using the water miscible solvent.

6. The method of claim 1, wherein removing the conductive layer comprises:
    removing first portions of the conductive layer using the first fluid ablation process while the conductive layer is attached to the first carrier substrate;
    attaching a second carrier substrate to the first major surface of the semiconductor wafer;
    removing the first carrier substrate; and
    removing second portions of the conductive layer using a second fluid ablation process.

7. The method of claim 6 further comprising:
    attaching a third carrier substrate onto the second major surface after removing the second portions; and
    removing the second carrier substrate.

8. The method of claim 7, wherein using the water miscible solvent occurs before removing the second carrier substrate.

9. The method of claim 1, wherein removing the conductive layer comprises:
    attaching a second carrier substrate to the first major surface of the semiconductor wafer;
    removing the first carrier substrate; and
    removing the conductive layer from the singulation lines using the first fluid ablation process.

10. The method of claim 9, wherein using the water miscible solvent occurs before removing the conductive layer.

11. The method of claim 1, wherein placing the semiconductor wafer onto the first carrier substrate comprises placing the semiconductor wafer onto a carrier tape.

12. The method of claim 1, wherein:
    using the water miscible solvent comprises using a heated water miscible solvent; and
    placing the semiconductor wafer onto the first carrier substrate comprises affixing the first carrier substrate to the conductive layer.

13. The method of claim 1, further comprising stretching the first carrier substrate for at least some period of time while removing the conductive layer.

14. A method of singulating a substrate comprising:
    providing a substrate having a plurality of die formed on the substrate and separated from each other by spaces, wherein the substrate has first and second opposing major surfaces, and wherein a conductive layer is formed overlying the second major surface;

providing a first carrier tape attached to a frame;

affixing the first carrier tape to the conductive layer;

plasma etching the substrate through the spaces to form singulation lines, wherein the singulation lines terminate in proximity to the conductive layer;

removing the conductive layer from the singulation lines using a first fluid ablation process; and using a water miscible solvent to remove at least portions of residual material resulting from the plasma etching step from surfaces of the plurality of die.

15. The method of claim 14, wherein:

using the water miscible solvent occurs before removing the conductive layer and occurs while the first carrier tape is attached to the frame;

using the water miscible solvent comprises using a heated water miscible solvent; and using the water miscible solvent comprises using a spray solvent apparatus to provide the water miscible solvent.

16. The method of claim 14, wherein removing the conductive layer comprises:

removing first portions of the conductive layer using the first fluid ablation process while the conductive layer is attached to the first carrier tape;

attaching a second carrier tape to the first major surface of the semiconductor wafer;

removing the first carrier tape;

removing second portions of the conductive layer using a second fluid ablation process;

attaching a third carrier tape onto the second major surface after removing the second portions; and removing the second carrier tape, and wherein using the water miscible solvent occurs after removing the second portions of the conductive layer.

17. A method of singulating semiconductor die from a semiconductor wafer comprising:

providing the semiconductor wafer having a plurality of semiconductor die formed as part of the semiconductor wafer and separated from each other by spaces defining where singulation lines will be formed, wherein the semiconductor wafer has first and second opposing major surfaces, and wherein a conductive layer is formed overlying the second major surface;

placing a first carrier substrate onto the conductive layer;

plasma etching the semiconductor wafer through the spaces to form the singulation lines while the semiconductor wafer is attached to the first carrier substrate and using the conductive layer as a stop layer;

thereafter physically removing the conductive layer from the singulation lines; and using a water miscible solvent to reduce the presence of residual contaminants resulting from the plasma etching step from surfaces of the plurality of semiconductor die.

18. The method of claim 17, wherein physically removing the conductive layer comprises:

attaching a second carrier substrate to the first major surface of the semiconductor wafer;

removing the first carrier substrate; and removing the conductive layer from the singulation lines using a first fluid ablation process.

19. The method of claim 17, wherein physically removing the conductive layer comprises:

removing first portions of the conductive layer using a first fluid ablation process while the conductive layer is attached to the first carrier substrate;

attaching a second carrier substrate to the first major surface of the semiconductor wafer;

removing the first carrier substrate; and removing second portions of the conductive layer using a second fluid ablation process;

attaching a third carrier substrate onto the second major surface after removing the second portions; and removing the second carrier substrate.

20. The method of claim 17, wherein using the water miscible solvent comprises:

performing the step of using the water miscible solvent before the step of removing the conductive layer;

using a heated water miscible solvent; and using a spray solvent apparatus to provide the heated water miscible solvent.

* * * * *